United States Patent [19]

Kitagawa et al.

[11] Patent Number: 4,919,614
[45] Date of Patent: Apr. 24, 1990

[54] APPARATUS FOR HEAT TREATMENT OF A SUBSTRATE

[75] Inventors: Kunio Kitagawa; Akira Maeda; Yoshio Matsumura, all of Kyoto, Japan

[73] Assignee: Dainippon Screen Mfg. Co., Ltd., Japan

[21] Appl. No.: 368,923

[22] Filed: Jun. 19, 1989

Related U.S. Application Data

[63] Continuation of Ser. No. 197,692, May 23, 1988, abandoned.

[30] Foreign Application Priority Data

May 30, 1987 [JP] Japan ............................. 62-85298[U]

[51] Int. Cl.$^5$ ............................................. F27D 5/00
[52] U.S. Cl. ........................................ 432/259; 432/258
[58] Field of Search ..................... 432/258, 259, 121

[56] References Cited

U.S. PATENT DOCUMENTS

| 1,941,941 | 1/1934 | Irwin | 432/259 |
|---|---|---|---|
| 2,208,734 | 7/1940 | Schreiber | 432/259 |
| 2,273,475 | 2/1942 | Schreiber | 432/259 |
| 3,266,116 | 8/1966 | Rush | 432/259 |
| 3,904,352 | 9/1975 | Thurnauer et al. | 432/259 |
| 3,948,594 | 4/1976 | Irwin, Jr. | 432/259 |
| 4,362,507 | 12/1982 | Antonucci | 432/259 |
| 4,407,654 | 10/1983 | Irwin | 432/259 |
| 4,715,812 | 12/1987 | von Matuschka et al. | 432/259 |

FOREIGN PATENT DOCUMENTS 57-37848  3/1982  Japan .

Primary Examiner—Henry C. Yuen
Attorney, Agent, or Firm—Ostrolenk, Faber, Gerb & Soffen

[57] ABSTRACT

An apparatus for the heat treatment of a substrate comprises a heat treating plate for heating or cooling a substrate, three holes for one substrate provided on the surface of the heat treating plate whose position is selected to suitably place the substrate, and three balls respectively in the three holes with the diameter of the balls being slightly larger than the depth of the holes. The substrate is retained on the three balls for heat treatment.

3 Claims, 4 Drawing Sheets

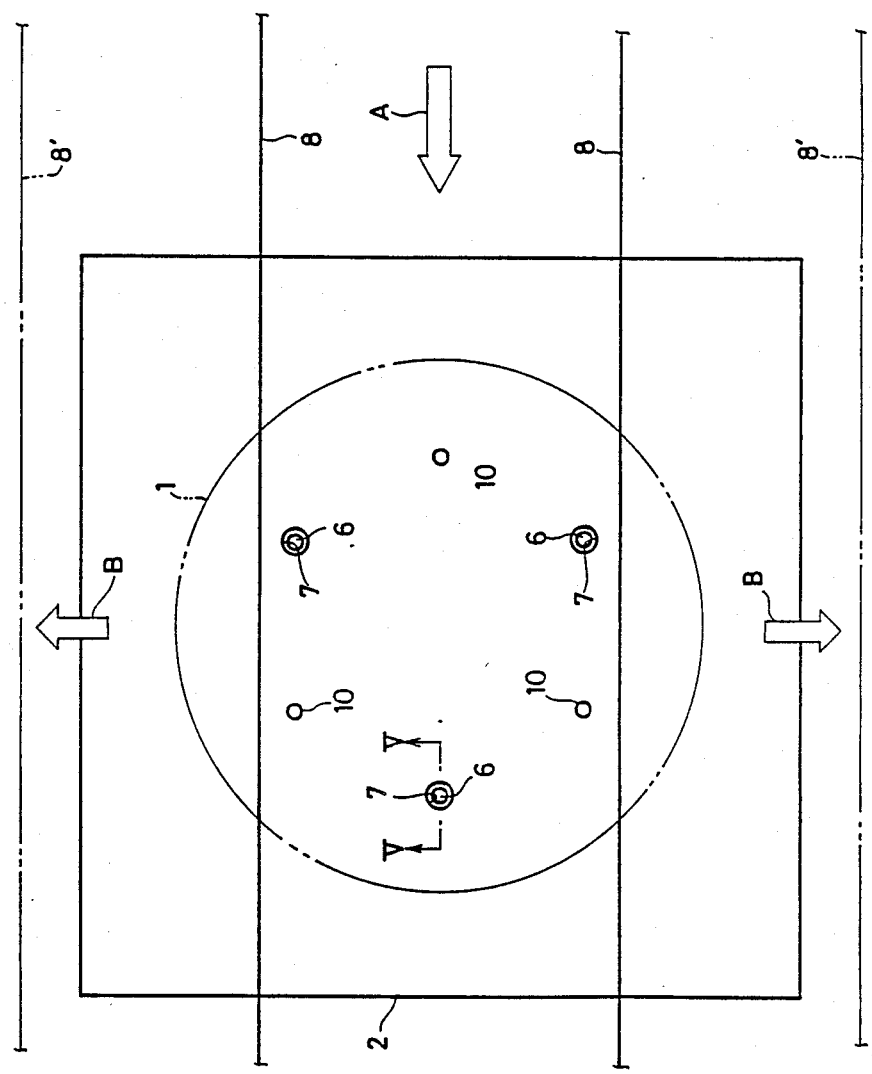

APPARATUS FOR HEAT TREATMENT OF A SUBSTRATE

This is a continuation of application Ser. No. 197,692, filed on May 23, 1988, now abandoned.

BACKGROUND OF THE INVENTION

1. Field of the Invention

The present invention relates to an apparatus for heat treatment employed in the manufacturing process of semiconductors, and, more specifically, it relates to an apparatus for heat treatment employed for heating or cooling a semiconductor wafer or a glass substrate (hereinafter generically referred to as a substrate) using a hot plate or a cooling plate.

2. Description of the Prior Art

A conventional apparatus for heat treatment of particular interest to the present invention is disclosed in, for example, Japanese Patent Laying-Open Gazette No. 37848/1982. Present FIGS. 1A to 1D show the structure of the heat treatment apparatus shown in the foregoing document. FIG. 1A is a perspective view of the heat treatment apparatus and FIG. 1B is a cross sectional view of the portion shown by the line IB—IB in FIG. 1A. Referring to FIGS. 1A and 1B, the heat treatment apparatus comprises a heating section HS, a heat transmitting section HT formed thereon, and a wafer placing section HP formed on the heat transmitting section HT. The heating section HS comprises heater blocks HB. The upper surface of the wafer placing section constitutes a surface of heat radiation section HPS. The surface of heat radiation section HPS is formed so as to enable effective heat radiation. A wafer W which is to be subjected to the heat treatment is placed on the surface of heat radiation section HPS with a spacer S interposed therebetween. The spacer S has a rod like shape.

FIGS. 1C and 1D show variations of the spacer S. The spacer S may be a lattice (FIG. 1C). The spacer S alternatively, may comprise three claw portions (FIG. 1D).

According to the above mentioned gazette, the conventional heat treatment apparatus has the following advantages. Namely, since the wafer is spaced above the heat radiation section of by a spacer, the wafer is heated by the heat radiation from the surface of the heat radiation section. Therefore, the wafer is heated with the temperature distribution being uniform. In addition, the heating ability is not very much degraded so long as the spacing between the surface of the heat radiation and the wafer is about 1 mm.

The conventional apparatus for the heat treatment of a substrate has the above-described advantages. However, the spacing d (in FIG. 1B) between the heating plate and the substrate has influences on the heating time when the substrate is heated or cooled to a prescribed temperature by the heat radiation. When the spacing d is about 1 mm, the influence is large.

FIG. 2 is a graph showing the relation between the temperature of the substrate and the time required for heating (hereinafter referred to as the heating characteristics) when the set temperature is 120° C. FIG. 3 is a graph showing the relation between the time required for cooling and the temperature of the substrate (hereinafter referred to as the cooling characteristics) when the set temperature is 25° C. The reference character d indicates the spacing between the heating plate and the substrate. The smaller the spacing d becomes, the faster the substrate reaches the set temperature.

In view of these graphs, the spacing d should be as small as possible, so long as it does not affect the substrate. By doing so, the rate for treating the substrate can be increased.

However, as described above, the conventional spacer has the shape of rod, lattice or a claw. Therefore, the spacer must be machined with higher precision in order to keep the spacing minute. For this reason, it was difficult in the conventional apparatus for the heat treatment of the substrate to keep the spacing small. If the spacer is machined with high precision in order to keep the spacing small, the cost of the substrate treatment apparatus becomes higher.

Meanwhile, the temperature distribution on the substrate should preferably be uniform. Therefore, the temperature difference between the portion where the substrate and the spacer are in contact with each other and the portion where they are apart from each other should be small. In order to attain the above described condition, the contact area of the spacer and the substrate should be as small as possible. When a conventional rod like or lattice spacer is employed, the contact area cannot be made small.

SUMMARY OF THE INVENTION

Therefore, an object of the present invention is to provide an apparatus for the heat treatment of a substrate in which the spacing between the substrate and the heating plate can be maintained small.

Another object of the present invention is to provide an apparatus for the heat treatment of a substrate in which the temperature distribution of the substrate to be heated or cooled is maintained uniform.

A further object of the present invention is to provide an apparatus for the heat treatment of a substrate in which the contact area between the spacer and the substrate can be reduced.

A still further object of the present invention is to provide an apparatus for the heat treatment of a substrate in which the spacing between the substrate and the heating plate can be easily maintained small.

The above objects of the present invention can be attained by an apparatus for the heat treatment of a substrate comprising: a heat treating plate having either heating or cooling means and a main surface; a plurality of concave portions arranged in spaced relationship with each other on the surface of the heat treating plate, whose positions are selected to place the substrate; and a plurality of balls held in the plurality of concave portions, each having a diameter slightly larger than the depth of the concave portion for placing the substrate on the top portion thereof.

Since the apparatus for the heat treatment of a substrate comprises the above-described components, the spacing between the substrate and the heat treatment apparatus is defined by the difference between the depth of the concave portion on the heat treating plate and the diameter of the ball retained therein. Therefore, by making the diameter of the ball slightly larger than the depth of the concave portion, an apparatus for the heat treatment of a substrate can be provided in which the spacing between the substrate and the heating plate can be maintained small.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a plan view of an apparatus for the heat treatment of a substrate in accordance with the present invention.

DESCRIPTION OF THE PREFERRED EMBODIMENTS

Figure 1A:
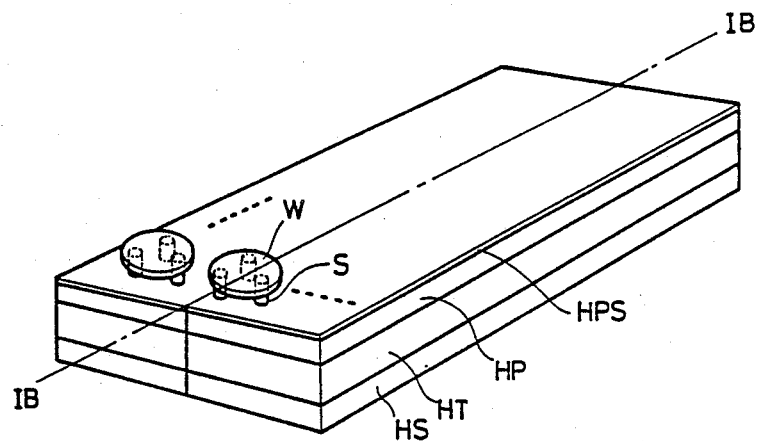
FIGS. 1A and 1B show a conventional apparatus for the heat treatment of a substrate.
Figure 1B:
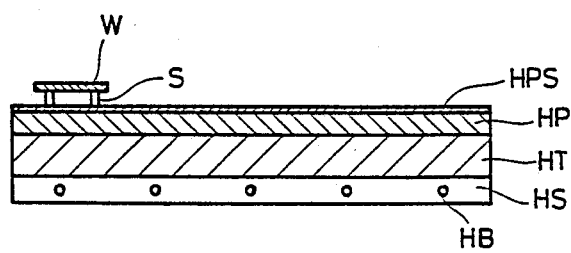
Figure 1C:
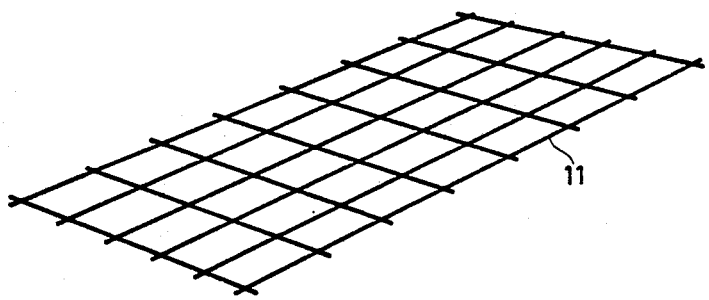
FIGS. 1C and 1D show variations of a conventional spacer.
Figure 1D:
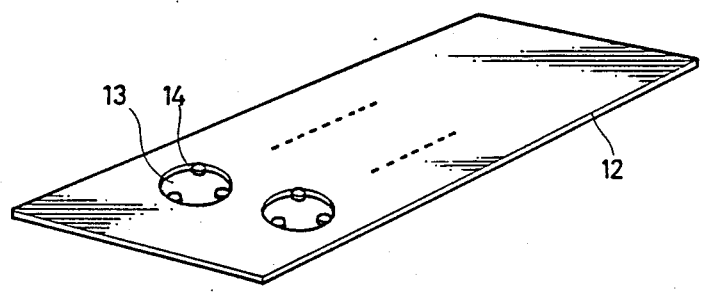

The embodiment of the present invention will be described in the following with reference to the drawing figures.

Figure 5:
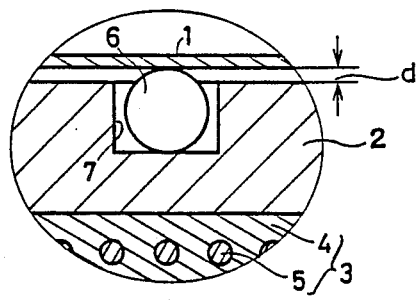
FIG. 5 is a partial cross sectional view of the apparatus for heat treatment of a substrate in accordance with the present invention.
Figure 2:
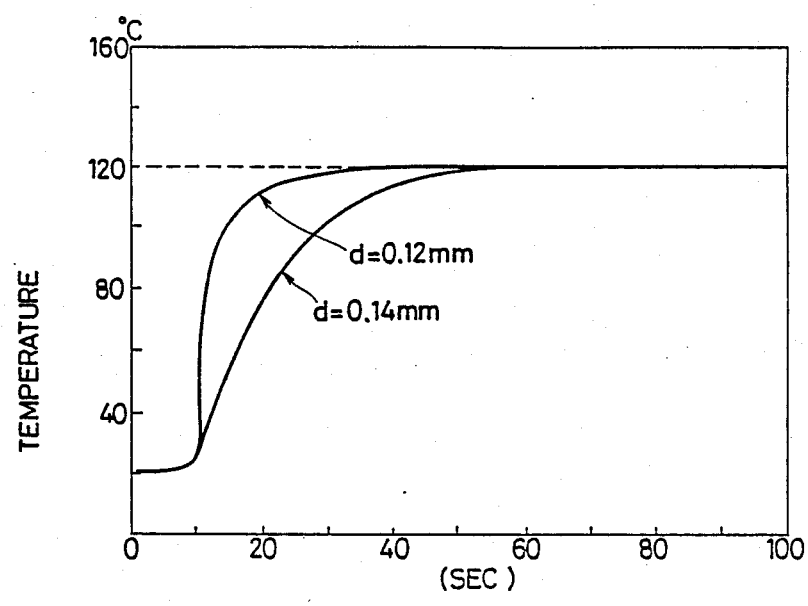
FIG. 2 shows the relation between the time and the substrate temperature in heating the substrate.
Figure 3:
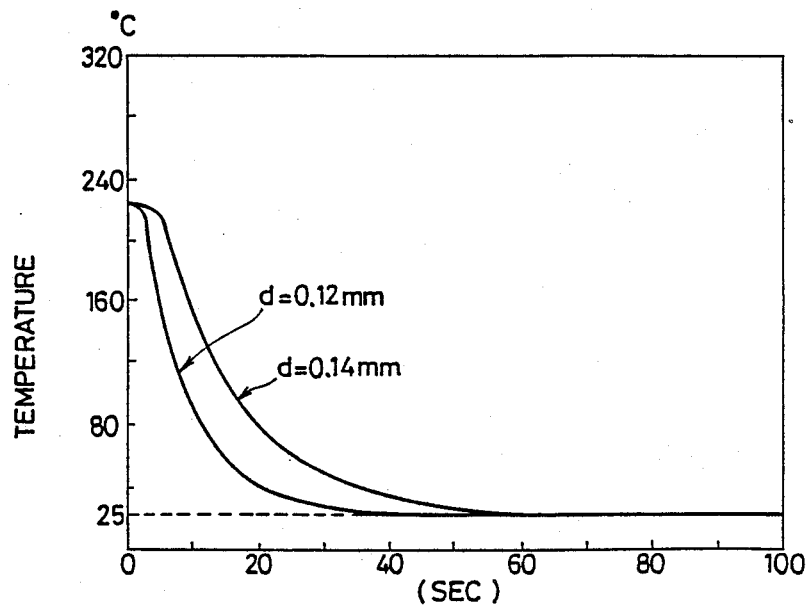
FIG. 3 shows the relation between the time and the substrate temperature in cooling the substrate.

FIG. 4 is a plan view of the heat treatment apparatus in accordance with the present invention and FIG. 5 is an enlarged cross sectional view taken along the line V—V of FIG. 4.

The heat treating apparatus comprises a heat treating plate 2, a heating device 3 provided in close contact with the lower surface of the heat treating plate 2, spacers 6 for supporting substrate arranged at three positions on the upper surface of the heat treating plate 2, a pair of substrate conveyer wires 8 8 provided above the heat treating plate 2, and pins 10 for delivering the substrate. The pin 10 for delivering the substrate comprises three pins provided so as to be elevated and lowered through the heat treating plate 2.

The heating device 3 comprises a heater 5 and a heat transmitting member 4 with the heater 5 embedded therein, and is closely attached to the lower surface of the heat treating plate 2. Consequently, the heat treating plate 2 is set at a desired temperature.

The substrate supporting spacer 6 is formed to have a ball shape by a heat insulating member such as alumina, steatite, and the like. Ball receptacles 7 are provided at three positions on the upper surface of the heat treating plate 2. The ball spacers 6 are detachably retained in the ball receptacles 7. A minute spacing d is formed between the substrate 1 supported by the spacer 6 and the surface of the heat treating plate 2. The ball receptacle 7 is milling machined: so as to ensure the flatness precision of the bottom surface and the depth precision thereof. In this embodiment, the ball spacer 6 is formed by a ceramic ball employing alumina as a material. When the ceramic ball 6 is fitted in the ball receptacle 7 having the diameter of about 2.4 mm $\phi$, the minute spacing d becomes 0.15 mm. The small spacing d is appropriately set dependent on the desired heating characteristics of the substrate 1 to be treated, the set temperature of the heat treating plate 2, and so on. According to the present invention, the minute spacing d can be very easily and highly precisely set only by replacing the ball spacers 6 with those having the desired diameter.

The feeding of the substrate to the apparatus for the heat treatment of a substrate and delivery of the substrate from the apparatus in accordance with the present invention will be described in the following. An example of a substrate conveying apparatus which can be applied to the apparatus for the heat treatment of a substrate in accordance with the present invention is disclosed in U.S. patent application Ser. No. 120,987 entitled "Apparatus and a Method for carrying Wafers" filed on Nov. 16, 1987 and assigned to the applicant of the present application. The above referenced United States patent application is incorporated herein by reference.

Referring to FIG. 4, the substrate 1 to be treated is mounted on the substrate delivering wires 8-8 and is fed onto the heat treating plate 2 from the direction of an arrow A. In this state, the substrate delivering pins 10 are elevated and substrate 1 is received by the three pins 10. The spacing between the wires 8 8 is widened in the direction of the arrow B. Consequently, the spacing between the wires 8-8 is moved from the delivering position to the retracting position 8'-8'.

The substrate delivering pins 10 receive the substrate 1. The substrate delivering pins lower after the wires 8-8 are moved to the retracted position. The substrate is transferred from the substrate delivering pin to the spacer 6.

When the heat treatment is completed, the substrate 1 is raised from the spacer 6 by the substrate delivering pins 10. The pair of wires 8-8 are moved from the retracted position to the conveying position and, thereafter, the pins 10 are lowered to mount the substrate 1 on the wires 8-8. The substrate is again delivered in the direction of the arrow A.

In the above described embodiment, the heat treating plate comprises the heating device. The heat treating plate may also comprise a cooling device. When the heat treating plate comprises a cooling device, the heat from the substrate 1 is radiated to the heat treating plate and is radiated from the heat treating plate to the cooling device.

The substrate delivering device is not limited to that shown in the above described embodiment. For example, a parallel retracting groove may be cut on the heating plate. The wires are retracted in the retracting grooves. By doing so, the pins can be omitted. Alternatively, the delivering device may comprise an articulated robot.

As described above, according to the present invention, the apparatus for the heat treatment of a substrate comprises the heat treating plate for heating or cooling the substrate, a plurality of concave portions provided in spaced relationship with each other on the main surface of the heat treating plate, and a plurality of balls retained in the concave portions, each having a diameter slightly larger than the depth of the concave portion for placing the substrate on the top portion thereof. Since the apparatus for the heat treatment of substrate comprises the above-described components, the spacing between the substrate and the heat treating apparatus is determined by the difference between the depth of the concave portion on the heat treating plate and the diameter of the ball retained therein. Therefore, by making the diameter of the ball slightly larger than the depth of the concave portion, an apparatus for the heat treatment of a substrate can be provided in which the spacing between the substrate and the heat treating plate can be maintained small.

Although the present invention has been described and illustrated in detail, it is clearly understood that the same is by way of illustration and example only and is not to be taken by way of limitation, the scope of the present invention being limited only by the terms of the appended claims.

What is claimed is:

1. An apparatus for the heat treatment of a substrate for heating or cooling the substrate, comprising:
    a heat treating plate having either heating or cooling means, a main surface and a plurality of through-holes arranged spaced apart from each other by a prescribed internal;
    three concave portions provided in spaced relationship with each other on a surface of said heat treating plate and each having the same depth, the positions of said three concave portions being selected so as to place said substrate a predetermined spacing above said main surface to facilitate heat exchange between said substrate and said main surface;
    three balls respectively and detachably retained in said three concave portions and having the same diameter which is larger than the depth of said concave portions for placing said substrate on the top portion thereof and thereby defining said predetermined spacing; and
    substrate elevating means capable of being protruded to said main surface of said heat treating plate and being retracted from said main surface through said through-holes with said means provided with a placing portion for placing said substrate on the upper portion thereof;
    said substrate elevating means comprising a plurality of pins which are raised and lowered through said plurality of through-holes and having their upper end portions maintained at the same height, with the upper end of said plurality of pins constituting said placing portions.

2. An apparatus according to claim 1, wherein said plurality of pins are maintained below said through-holes of said heat treating plate when said substrate is heat treated.

3. An apparatus according to claim 2, wherein said plurality of pins comprises three pins for said one substrate.

* * * * *